(12) United States Patent
Jones

(10) Patent No.: US 6,472,936 B1
(45) Date of Patent: Oct. 29, 2002

(54) LOW-NOISE GAIN SWITCHING CIRCUIT USING TAPPED INDUCTOR

(75) Inventor: Mark Alan Jones, Tucson, AZ (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/854,821

(22) Filed: May 14, 2001

(51) Int. Cl.$^7$ .............. H03F 1/14; H03F 3/68; H03F 3/60
(52) U.S. Cl. ............ 330/51; 330/295; 330/286
(58) Field of Search .................. 330/51, 295, 286, 330/276

(56) References Cited

U.S. PATENT DOCUMENTS

| | | | | |
|---|---|---|---|---|
| 3,839,683 A | * | 10/1974 | Edson | 330/300 |
| 3,903,434 A | * | 9/1975 | Rauchenecker | 330/298 |
| 4,864,247 A | * | 9/1989 | Baur | 330/252 |
| 5,570,062 A | * | 10/1996 | Dent | 330/51 |

* cited by examiner

Primary Examiner—Patricia Nguyen

(57) ABSTRACT

There is disclosed an improved variable gain low-noise amplifier. The variable gain low-noise amplifier comprises: 1) an input transistor having a first ground terminal coupled to ground and an input terminal coupled to an input signal; 2) N output transistor, each of the N output transistors having a first output terminal coupled to a second output terminal of the input transistor; 3) N switches, each of the N switches turning a corresponding one of the N output transistors ON and OFF by selectively coupling an input terminal of the corresponding one of the N output transistors to one of: 1) an enabling voltage and 2) a disabling voltage; and 4) an inductor comprising a first inductor terminal coupled to a supply voltage, a second inductor terminal coupled to a second output terminal of a first one of the N output transistors, and N−1 tap points intermediate the first and second inductor terminals, each of the N−1 tap points coupled to a second output terminal of a corresponding one of the remaining N−1 output transistors.

25 Claims, 2 Drawing Sheets

LOW-NOISE GAIN SWITCHING CIRCUIT USING TAPPED INDUCTOR

TECHNICAL FIELD OF THE INVENTION

The present invention is generally directed to RF transceivers and, in particular, to a low-noise amplifier circuit for use in a RF transceiver.

BACKGROUND OF THE INVENTION

The power consumption, speed, noise, and distortion characteristics of radio frequency (RF) transceivers are significantly affected by the performance of the RF amplifiers used in the transmit signal path and the receive signal path. If an amplifier has good (or high) linearity, the amount of signal distortion introduced by amplification is minimized and high signal quality is maintained in the presence of larger interfering signals. However, in order to maintain high linearity, an amplifier must be operated at power supply voltages that are much higher that the average peak-to-peak signal voltage. This greatly increases the power consumption of the RF amplifier, resulting in a tradeoff between linear performance and power consumption.

Often it is desirable to switch the gain of a low-noise amplifier (LNA) at the front-end of a receiver to compensate for varying signal conditions at the input of the radio receiver. For instance, for low input signal strength, maximum gain is desired to increase the sensitivity of the receive path. However, if large interfering signals are present along with a medium strength information signal, it may be advantageous to reduce the LNA gain such that the interfering signals do not overload subsequent blocks in the receive path.

Commonly used techniques of adjusting LNA gain have well-known drawbacks. FIG. 2 illustrates selected portions of low-noise amplifier (LNA) 105 in the exemplary RF transceiver according to one embodiment of the prior art. For ease of explanation, DC bias circuits are omitted from the illustrated embodiment. Prior art LNA 105 comprises inductor 205, n-p-n transistor 210, n-p-n transistor 215, and MOS transistor 220. An input signal, IN, is applied to the base of input transistor 215. A DC bias signal, DC, is applied to the base of output transistor 210 to establish a DC bias current through inductor 205. The IN signal is amplified by transistors 215 and 210 to produce the output signal, OUT, at the collector of transistor 210.

Under normal operation, MOS transistor 220 is fixed in an OFF state by gate voltage CONTROL and appears as an open circuit. When the input voltage CONTROL is switched ON to affect a reduced gain state, MOS transistor 220 shunts the input current away from input transistor 215 and straight into output transistor 210. This reduces the gain according to the value of the CONTROL signal applied to the gate of MOS transistor 220. This LNA bypass mode has the twin disadvantages of high noise figure (NF) and poor return loss. High NF degrades system sensitivity and degradation of return loss reduces the effectiveness of any bandpass filter placed in front of low-noise amplifier 205.

Another method of LNA gain adjustment involves placing a variable attenuator after LNA 105. Although this technique allows for constant return loss over various gain states, it suffers from clumsy implementation within the confines of an integrated circuit. This is especially true in a BiCMOS or SiGe process, wherein the attenuator switching devices most likely are large MOS devices having parasitic loading effects that can limit the maximum gain and/or bandwidth of the low-noise amplifier. Furthermore, the switching devices used to change the attenuator range may cause non-linearities, reducing the LNA input intercept, a critical factor in many receive signal paths.

Therefore, there is a need in the art for improved low-noise amplifier devices for use in RF transceivers. In particular, there is a need for a variable gain low-noise amplifier in which the gain may be adjusted without increasing noise figure and degrading return loss. More particularly, there is a need for an improved variable gain low-noise amplifier that is easy to integrate in an integrated circuit without using attenuator switching devices that have large parasitic loading effects.

SUMMARY OF THE INVENTION

To address the above-discussed deficiencies of the prior art, it is a primary object of the present invention to provide an improved variable gain low-noise amplifier. According to an advantageous embodiment of the present invention, the low-noise amplifier comprises: 1) an input transistor having a first ground terminal coupled to ground and an input terminal coupled to an input signal; 2) a first output transistor having a first output terminal coupled to a second output terminal of the input transistor; 3) a first switch capable of turning the first output transistor ON and OFF by selectively coupling an input terminal of the first output transistor to one of: a) a first enabling voltage and b) a first disabling voltage; 4) a second output transistor having a first output terminal coupled to the second output terminal of the input transistor; 5) a second switch capable of turning the second output transistor ON and OFF by selectively coupling an input terminal of the second output transistor to one of: a) a second enabling voltage and b) a second disabling voltage; and 6) an inductor comprising a first inductor terminal coupled to a supply voltage, a second inductor terminal coupled to a second output terminal of the first output transistor, and a first tap point intermediate the first and second inductor terminals coupled to a second output terminal of the second output transistor.

According to one embodiment of the present invention, the input transistor is an n-p-n transistor.

According to another embodiment of the present invention, the first and second output transistors are n-p-n transistors.

According to still another embodiment of the present invention, the input transistor is an n-p-n transistor, the first and second output transistors are n-p-n transistors, and the first and second disabling voltages are ground reference points.

According to yet another embodiment of the present invention, the input transistor is an n-p-n transistor, the first and second output transistors are n-p-n transistors, and the first and second enabling voltages are bias voltages approximately equal to twice the value of a base-emitter voltage of the first and second output transistors.

According to a further embodiment of the present invention, the input transistor is a MOSFET device.

According to a still further embodiment of the present invention, the first and second output transistors are MOSFET devices.

In one embodiment of the present invention, the variable gain low-noise amplifier further comprises: 1) a third output transistor having a first output terminal coupled to the second output terminal of the input transistor; and 2) a third switch capable of turning the third output transistor ON and OFF by selectively coupling an input terminal of the third output transistor to one of: a) the enabling voltage and b) the disabling voltage.

In another embodiment of the present invention, the inductor further comprises a second tap point intermediate the first tap point and the second inductor terminal coupled to a second output terminal of the third output transistor.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 4, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged low-noise amplifier.

Figure 1A:
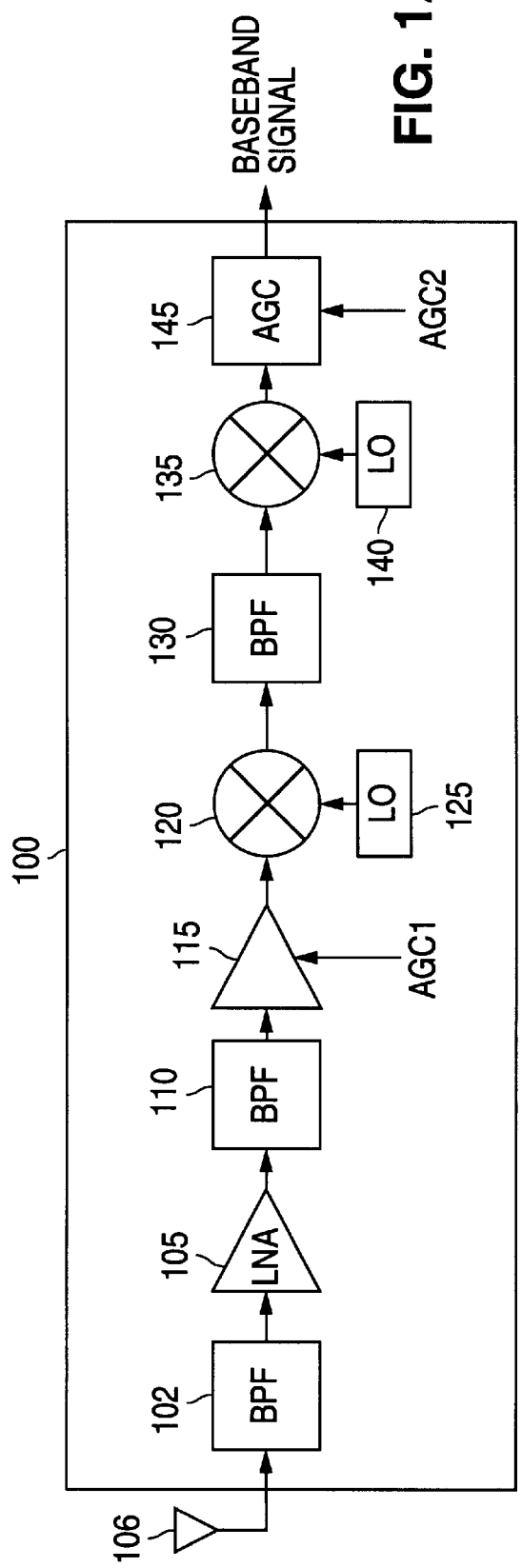
FIG. 1A illustrates selected portions of the receive signal path of an exemplary RF transceiver according to one embodiment of the present invention.

FIG. 1A illustrates selected portions of the receive signal path of exemplary RF transceiver 100 according to one embodiment of the present invention. RF transceiver 100 may represent any conventional RF communication device, including a cell phone, a wireless network card, a two-way pager, and the like. The RF receive path through RF transceiver 100 comprises bandpass filter (BPF) 102, which receives an incoming RF signal from antenna 106 and isolates the frequencies of interest, and low-noise amplifier (LNA) 105. The RF receive path further comprises band pass filter (BPF) 110, RF amplifier 115, RF mixer 120, local oscillator (LO) 125, band pass filter (BPF) 110, intermediate frequency (IF) mixer 135, local oscillator (LO) 140, and automatic gain control (AGC) circuit 145.

LNA 105 amplifies filtered incoming RF signal from BPF 102 to an intermediate level. BPF 110 filters the output of LNA 105 to remove noise outside of the desired receiver frequency range. RF amplifier 115 further amplifies the output of BPF 110 by a variable amount of gain determined by the gain control signal AGC1. RF mixer 115 down-converts the output of RF amplifier 115 by mixing it with the local oscillator reference signal from LO 125 to produce an intermediate frequency (IF) signal. RF mixer 115 effectively shifts the RF signal centered around the receiver RF operating frequency down to an intermediate frequency (IF) signal.

At this point, the signal output by RF mixer 115 may have spurious signals outside of the desired frequency range which have been amplified and/or introduced by the amplification steps. BPF 130 is an extremely narrow filter that blocks all but the desired frequencies of interest from reaching IF mixer 135. IF mixer 135 down-converts the IF output of BPF 130 by mixing it with the local oscillator reference signal from LO 140 to produce a baseband signal. AGC circuit 145 further amplifies the output of IF mixer 145 by a variable amount of gain determined by the gain control signal AGC2.

Figure 1B:
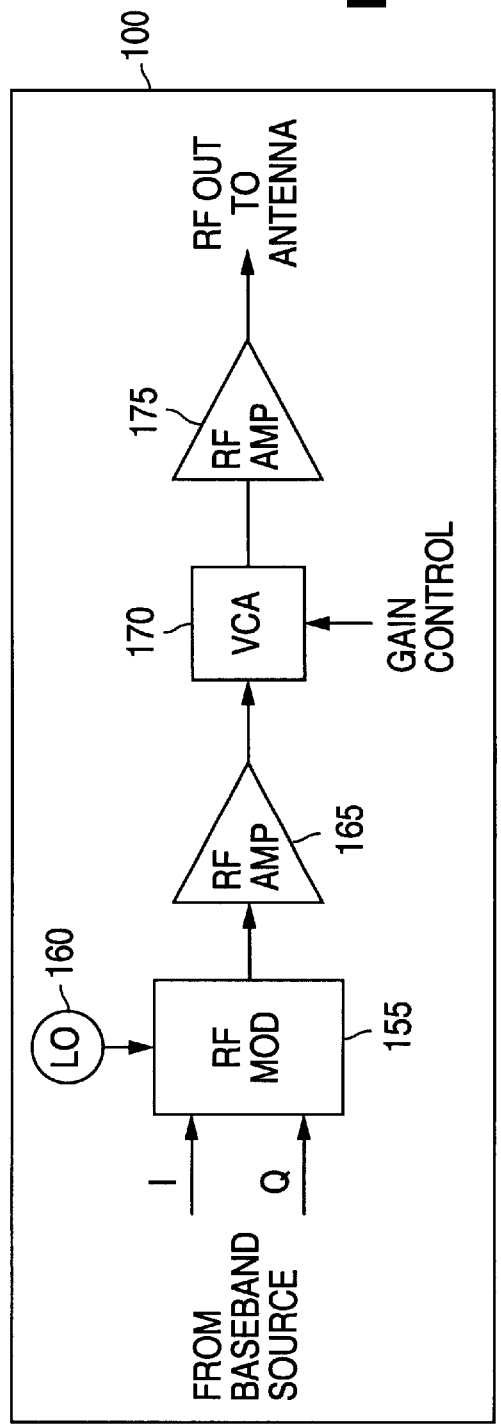
FIG. 1B illustrates selected portions of the transmit signal path of the exemplary RF transceiver according to one embodiment of the present invention.
Figure 2:
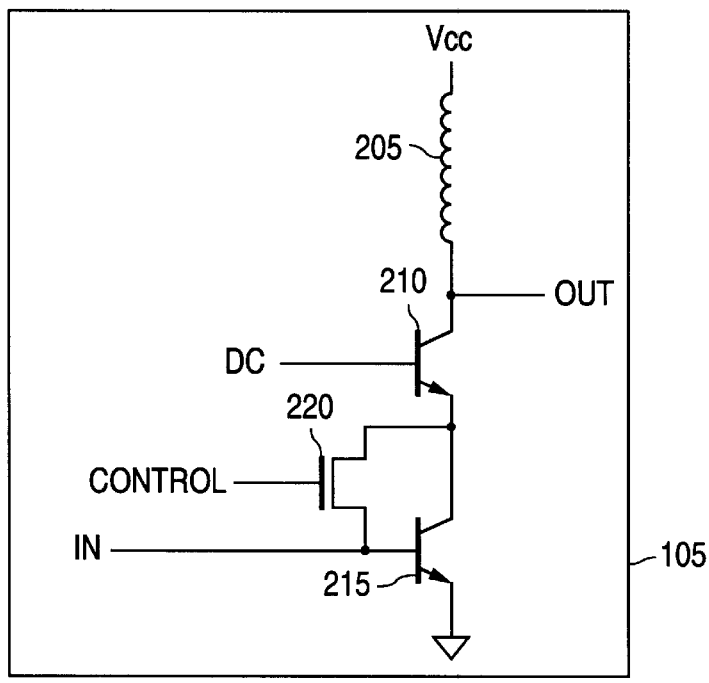
FIG. 2 illustrates selected portions of a low-noise amplifier in the exemplary RF transceiver in FIG. 1 according to one embodiment of the prior art.

FIG. 1B illustrates selected portions of the transmit signal path of exemplary RF transceiver 100 according to one embodiment of the present invention. The transmit path comprises radio frequency (RF) modulator 155, local oscillator (LO) 160, RF amplifier 165, voltage-controlled attenuator (VCA) 170, and RF amplifier 175. RF modulator 155 receives a baseband in-phase (I) signal and a baseband quadrature (Q) signal from a baseband source and a quadrature source mixes them with a reference carrier signal received from LO 160 to produce an RF output signal. The RF output signal is then amplified by RF amplifier 165 to an intermediate level in the range of VCA 170. VCA 170 attenuates the amplified RF output from RF amplifier 165 and the attenuated RF output of VCA 170 is amplified by RF amplifier 175 to a level suitable for transmission by antenna 106. The attenuation factor applied by VCA 170 is controlled by the value of the GAIN CONTROL signal.

Figure 3:
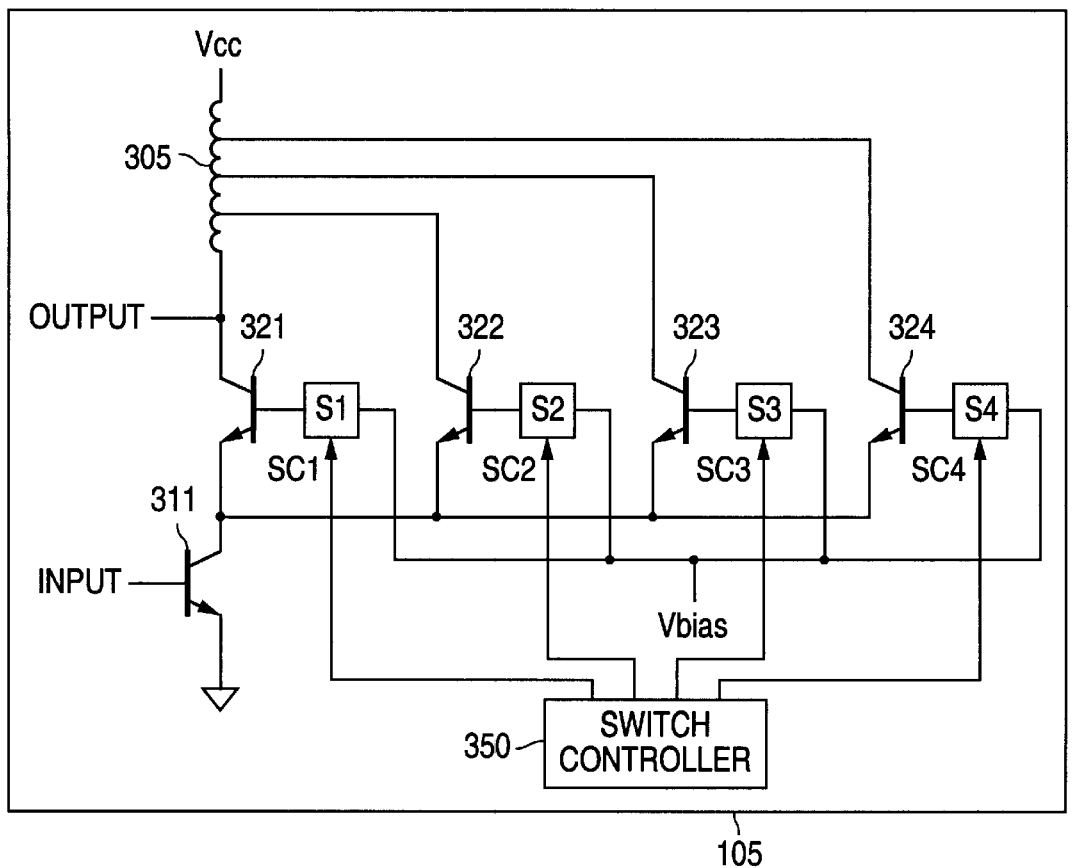
FIG. 3 illustrates selected portions of an improved low-noise amplifier (LNA) in the exemplary RF transceiver in FIG. 1 according to one embodiment of the present invention.

The transmit and receive paths of transceiver 100 comprise a number of low-noise amplifiers. These low-noise amplifiers may include one or more tapped inductors according to the principles of the present invention. FIG. 3 illustrates selected portions of improved low-noise amplifier (LNA) 105 in exemplary RF transceiver 100 according to one embodiment of the present invention. For ease of explanation, conventional DC biasing circuits are omitted from the illustrated embodiment. LNA 105 comprises tapped inductor 305, input n-p-n transistor 311, multiple cascode output transistors, including n-p-n transistors 321, 322, 323, and 324, and switch controller 350. The present invention provides for gain adjustment of any number of steps without any of the weaknesses of the prior art described above. The present invention allows for constant input return loss, low noise across multiple gain settings, high linearity, and easy implementation within an integrated circuit.

An input device, transistor 311, is coupled to multiple cascode output devices (not a single cascode device, as is commonly used as an LNA topology). In the exemplary embodiment, four output devices are used. However, this is by way of illustration and should be construed so as to limit the scope of the present invention. In alternate embodiments of the present invention, more than four output devices or less than four output devices may be used. Generally speaking, between 2 and N cascode output devices may be used.

Each cascode device may have its base coupled to a DC voltage, Vbias, by means of switches S1, S2, S3, and S4 and can be switched to an ON state or an OFF state by switch controller 350 using switch control signals SC1, SC2, SC3, and SC4 respectively. Switch controller 350 operates such that one and only one of control signals SC1, SC2, SC3, and SC4 is active at any time. Thus, only one of transistors 321–324 is ON at any time. In an exemplary embodiment, the ON state is Vbias=2*Vbe, and the OFF state is Vbias=0. The collector of one cascode device, transistor 321, is coupled to one terminal of inductor 305, fabricated within the same integrated circuit as the transistors. The collectors of the other cascode devices, transistors 322–324, are coupled to different tap points along the windings of inductor 305, between the two terminals.

When cascode transistor 321 is ON (and transistors 322–324 are OFF), the full RF current produced by transistor 311 is routed between the terminals of inductor 305 and is available at the output pin, OUTPUT. When transistor 322 is ON (and transistors 321, 323, and 324 are OFF), the RF current produced by transistor 311 enters inductor 305 at the tap point coupled to the collector of transistor 322 and the current is split between the output pin and the supply pin Vcc, thereby reducing the gain. Similarly, when transistor 323 is ON (and transistors 321, 322, and 324 are OFF), the RF current produced by transistor 311 enters inductor 305 at the tap point coupled to the collector of transistor 323 and the current is split between the output pin and the supply pin Vcc, reducing the gain even further. Finally, when transistor 324 is ON (and transistors 321–323 are OFF), the RF current produced by transistor 311 enters inductor 305 at the tap point coupled to the collector of transistor 324 and the current is split between the output pin and the supply pin Vcc, thereby reducing the gain still further.

As is apparent from the above description, the amount of gain reduction (i.e., the gain step) can be precisely controlled by the physical location of the tap point along the windings of inductor 305. The closer the tap point is to the output terminal, the higher the absolute gain is. The closer the tap point is to Vcc, the lower the absolute gain is.

In an advantageous embodiment of the present invention, three gain states (full gain, medium gain, and low gain) may be implemented. In such an embodiment, transistors 321–323 in FIG. 3 would be implemented and transistor 324 would be deleted. Gain control is achieved by providing switched current sources (i.e., S1, S2, S3) to turn the cascode devices ON or OFF. The switching of the current may be done in any number of ways common to transistor-level IC design and will be apparent to those skilled in the art. Furthermore, the use of n-p-n transistors for transistor 311 and transistors 321–324 was by way of illustration only. Those skilled in the art will understand that in alternate embodiments of the present invention, LNA 105 may be fabricated using other types of devices, including MOSFET devices.

Although the present invention has been described in detail, those skilled in the art should understand that they can make various changes, substitutions and alterations herein without departing from the spirit and scope of the invention in its broadest form.

What is claimed is:

1. A variable gain low-noise amplifier comprising:

an input transistor having a first ground terminal coupled to ground and an input terminal coupled to an input signal;

a first output transistor having a first output terminal coupled to a second output terminal of said input transistor;

a first switch capable of turning said first output transistor ON and OFF by selectively coupling an input terminal of said first output transistor to one of: 1) a first enabling voltage and 2) a first disabling voltage;

a second output transistor having a first output terminal coupled to said second output terminal of said input transistor;

a second switch capable of turning said second output transistor ON and OFF by selectively coupling an input terminal of said second output transistor to one of: 1) a second enabling voltage and 2) a second disabling voltage; and an inductor comprising a first inductor terminal coupled to a supply voltage, a second inductor terminal coupled to a second output terminal of said first output transistor, and a first tap point intermediate said first and second inductor terminals coupled to a second output terminal of said second output transistor.

2. The variable gain low-noise amplifier as set forth in claim 1 wherein said input transistor is an n-p-n transistor.

3. The variable gain low-noise amplifier as set forth in claim 1 wherein said first and second output transistors are n-p-n transistors.

4. The variable gain low-noise amplifier as set forth in claim 1 wherein said input transistor is an n-p-n transistor, said first and second output transistors are n-p-n transistors, and said first and second disabling voltages are ground reference points.

5. The variable gain low-noise amplifier as set forth in claim 1 wherein said input transistor is an n-p-n transistor, said first and second output transistors are n-p-n transistors, and said first and second enabling voltages are bias voltages approximately equal to twice the value of a base-emitter voltage of said first and second output transistors.

6. The variable gain low-noise amplifier as set forth in claim 1 wherein said input transistor is a MOSFET device.

7. The variable gain low-noise amplifier as set forth in claim 1 wherein said first and second output transistors are MOSFET devices.

8. The variable gain low-noise amplifier as set forth in claim 1 further comprising:

a third output transistor having a first output terminal coupled to said second output terminal of said input transistor; and a third switch capable of turning said third output transistor ON and OFF by selectively coupling an input terminal of said third output transistor to one of: 1) said enabling voltage and 2) said disabling voltage.

9. The variable gain low-noise amplifier as set forth in claim 8 wherein said inductor further comprises a second tap point intermediate said first tap point and said second inductor terminal coupled to a second output terminal of said third output transistor.

10. A radio frequency (RF) receiver comprising:

a receiver front-end circuit capable of receiving an incoming RF signal from an antenna and generating an amplified RF output signal, said receiver front-end circuit comprising:

a variable gain low-noise amplifier comprising:

an input transistor having a first ground terminal coupled to ground and an input terminal coupled to said incoming RF signal;

a first output transistor having a first output terminal coupled to a second output terminal of said input transistor;

a first switch capable of turning said first output transistor ON and OFF by selectively coupling an input terminal of said first output transistor to one of: 1) a first enabling voltage and 2) a first disabling voltage;

a second output transistor having a first output terminal coupled to said second output terminal of said input transistor;

a second switch capable of turning said second output transistor ON and OFF by selectively coupling an input terminal of said second output transistor to one of: 1) a second enabling voltage and 2) a second disabling voltage; and an inductor comprising a first inductor terminal coupled to a supply voltage, a second inductor terminal coupled to a second output terminal of said first output transistor, and a first tap point intermediate said first and second inductor terminals coupled to a second output terminal of said second output transistor; and demodulation circuitry coupled to said receiver front-end circuitry capable of demodulating said amplified RF output signal.

11. The radio frequency (RF) receiver as set forth in claim 10 wherein said input transistor is an n-p-n transistor.

12. The radio frequency (RF) receiver as set forth in claim 10 wherein said first and second output transistors are n-p-n transistors.

13. The radio frequency (RF) receiver as set forth in claim 10 wherein said input transistor is an n-p-n transistor, said first and second output transistors are n-p-n transistors, and said first and second disabling voltages are ground reference points.

14. The radio frequency (RF) receiver as set forth in claim 10 wherein said input transistor is an n-p-n transistor, said first and second output transistors are n-p-n transistors, and said first and second enabling voltages are bias voltages approximately equal to twice the value of a base-emitter voltage of said first and second output transistors.

15. The radio frequency (RF) receiver as set forth in claim 10 wherein said input transistor is a MOSFET device.

16. The radio frequency (RF) receiver as set forth in claim 10 wherein said first and second output transistors are MOSFET devices.

17. The radio frequency (RF) receiver as set forth in claim 10 further comprising:

a third output transistor having a first output terminal coupled to said second output terminal of said input transistor;

a third switch capable of turning said third output transistor ON and OFF by selectively coupling an input terminal of said third output transistor to one of: 1) said enabling voltage and 2) said disabling voltage.

18. The radio frequency (RF) receiver as set forth in claim 17 wherein said inductor further comprises a second tap point intermediate said first tap point and said second inductor terminal coupled to a second output terminal of said third output transistor.

19. A variable gain low-noise amplifier comprising:

an input transistor having a first ground terminal coupled to ground and an input terminal coupled to an input signal;

N output transistors, each of said N output transistors having a first output terminal coupled to a second output terminal of said input transistor;

N switches, each of said N switches capable of turning a corresponding one of said N output transistors ON and OFF by selectively coupling an input terminal of said corresponding one of said N output transistors to one of: 1) an enabling voltage and 2) a disabling voltage; and an inductor comprising a first inductor terminal coupled to a supply voltage, a second inductor terminal coupled to a second output terminal of a first one of said N output transistors, and N−1 tap points intermediate said first and second inductor terminals, each of said N−1 tap points coupled to a second output terminal of a corresponding one of the remaining N−1 output transistors.

20. The variable gain low-noise amplifier as set forth in claim 19 wherein said input transistor is an n-p-n transistor.

21. The variable gain low-noise amplifier as set forth in claim 19 wherein said N output transistors are n-p-n transistors.

22. The variable gain low-noise amplifier as set forth in claim 19 wherein said input transistor is an n-p-n transistor, said N output transistors are n-p-n transistors, and said disabling voltage is a ground reference point.

23. The variable gain low-noise amplifier as set forth in claim 19 wherein said input transistor is an n-p-n transistor, said N output transistors are n-p-n transistors, and said enabling voltage is a bias voltage approximately equal to twice the value of a base-emitter voltage of said N output transistors.

24. The variable gain low-noise amplifier as set forth in claim 19 wherein said input transistor is a MOSFET device.

25. The variable gain low-noise amplifier as set forth in claim 19 wherein said N output transistors are MOSFET devices.

* * * * *